United States Patent [19]
Mietus et al.

[11] Patent Number: 5,424,897
[45] Date of Patent: Jun. 13, 1995

[54] THREE LEADED PROTECTED POWER DEVICE HAVING VOLTAGE INPUT

[75] Inventors: David F. Mietus, Phoenix; Robert B. Davies, Tempe, both of Ariz.

[73] Assignee: Motorola, Inc., Schaumburg, Ill.

[21] Appl. No.: 43,948

[22] Filed: Apr. 5, 1993

[51] Int. Cl.6 .................................. H03K 17/56
[52] U.S. Cl. ............................... 361/91; 361/93; 361/103; 361/115
[58] Field of Search ............... 361/91, 93, 18, 86, 361/88, 89, 94, 101, 115, 98, 103

[56] References Cited

U.S. PATENT DOCUMENTS

| | | | |
|---|---|---|---|
| 5,091,664 | 2/1992 | Furuhata | 361/98 |
| 5,200,879 | 4/1993 | Sasagawa | 361/93 |

Primary Examiner—Marc S. Hoff
Assistant Examiner—S. Jackson
Attorney, Agent, or Firm—Rennie William Dover

[57] ABSTRACT

A voltage driven control die (20) for use with a power device (22) has been provided. The voltage driven control die includes an under voltage lock-out circuit (46) which inhibits drive to the power device until the input voltage exceeds a predetermined threshold voltage. Moreover, the control die includes a noise immunity enhancement circuit (56) for providing an excess reverse bias across an output SCR (58) for preventing false triggering of the output SCR. The control die also includes circuitry (40, 44) for detecting an over temperature or an over current condition within the power device.

11 Claims, 4 Drawing Sheets

THREE LEADED PROTECTED POWER DEVICE HAVING VOLTAGE INPUT

FIELD OF THE INVENTION

This invention relates to circuits, for example, a voltage driven circuit for controlling the operation of a power device.

BACKGROUND OF THE INVENTION

Power devices are utilized in a plurality of circuit applications that require high voltage and current capability, for example, automotive circuits. However, even power devices must be protected from large surge currents which could destroy the device.

Control circuits are typically utilized to protect power transistors by, for example, monitoring the current flowing through the power transistor. One type of control circuit for protecting a power device is fully disclosed in U.S. Pat. No. 5,285,346 issued to Davies et al. on Feb. 8, 1994 and entitled "CURRENT DRIVEN CONTROL CIRCUIT FOR A POWER DEVICE". However, the control circuit disclosed here is a current driven control circuit wherein a current driven control circuit requires its input to be clamped.

There also exists control circuits that are voltage driven. However, such control circuits are typically implemented such that they monitor conditions of a power transistor after power has already been supplied to the power transistor. Thus, this has the disadvantage of damaging the power transistor in the case of quick and large surge signals wherein the control circuitry can not act in a sufficient amount of time to prevent damage to the power transistor.

Hence, there is a need for an improved voltage driven circuit for protecting a power device that monitors the input signal to the power transistor before the signal is applied to the transistor.

DETAILED DESCRIPTION OF THE DRAWINGS

Figure 1:
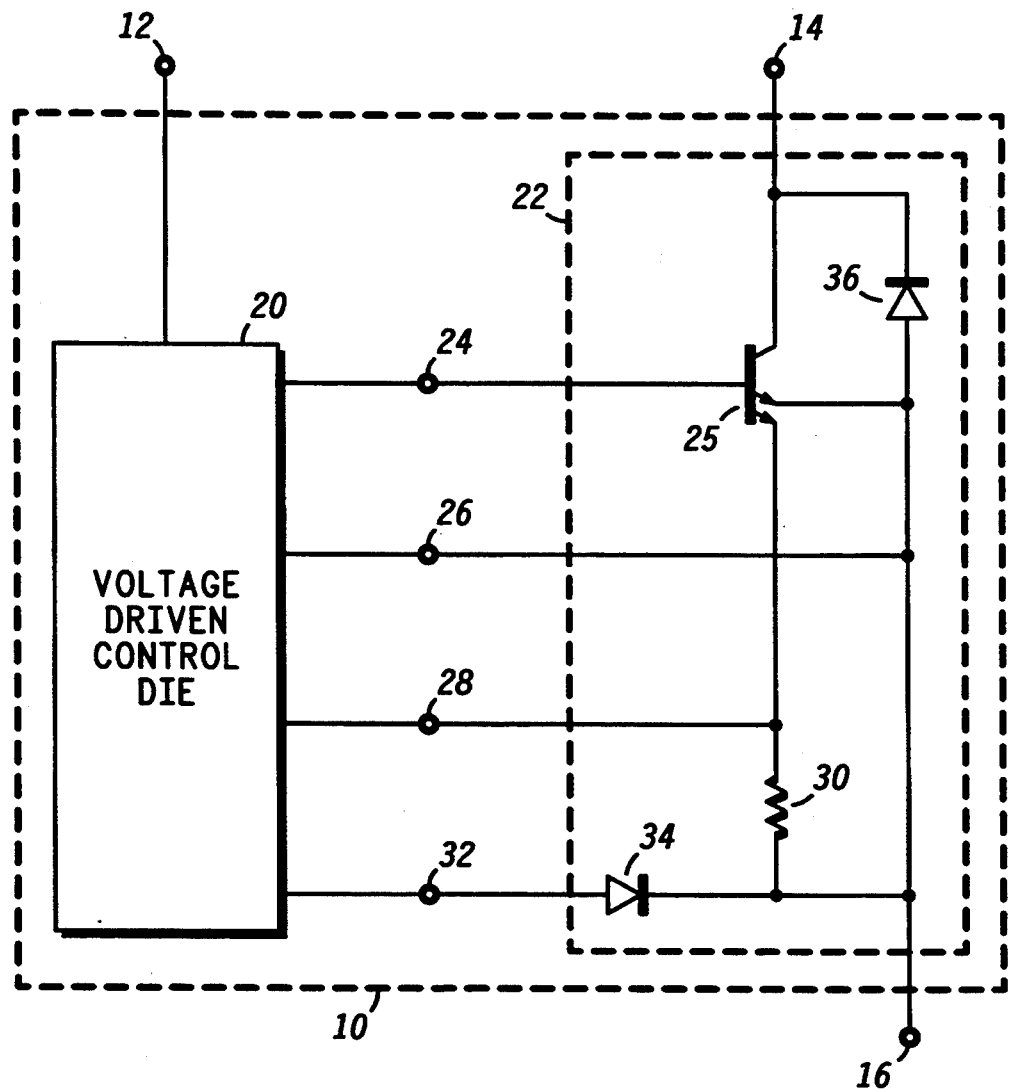
FIG. 1 is a schematic/block diagram illustrating a voltage driven control circuit coupled to a power device for protecting the power device.

Referring to FIG. 1, there is illustrated three leaded device 10 having voltage input terminal 12 and first and second terminals 14 and 16. Package 10 includes voltage driven control die 20 for protecting power device 22.

Power device 22 includes insulated gate bipolar transistor 25 which has a collector coupled to terminal 14 and a first emitter coupled to terminal 16. Power device 22 also includes diode 36 being coupled across current carrying terminals 14 and 16 whereby the anode of diode 36 is coupled to terminal 16 and the cathode of diode 36 is coupled to terminal 14. The control electrode of transistor 25 is coupled to terminal 24.

Voltage driven control die 20 is coupled to terminal 24. Voltage driven control die 20 is also coupled to terminal 26 which is coupled to a first emitter of transistor 25. Voltage driven control die 20 is also coupled to terminal 28 which is subsequently coupled to a second emitter of transistor 25. Terminal 28 is also coupled through resistor 30 to terminal 16. Finally, voltage driven control die 20 is coupled to terminal 32 which is subsequently coupled through diode 34 to the first emitter of power device 22.

In general, voltage driven control die 20 controls whether power device 22 is rendered operative or non-operative because a voltage input signal applied at terminal 12 must first pass through control die 20 before being supplied to the control electrode of transistor 25. Thus, if control die 20 detects a fault condition within power device 22 (via terminals 26, 28 and 32) then control die 20 can disable power device 22 by removing the voltage appearing at the control electrode of transistor 25.

The technique used to incorporate control die 20 and power device 22 in package 10 may be, for example, the technique disclosed in U.S. Pat. No. 5,170,312, issued Dec. 8, 1992, which discloses the concept of mounting control die 20 on the control electrode lead of power device 22.

It is understood that resistor 30 and the second emitter of power device 22 constitutes a typical method of sensing current through power die. However, it is understood that the current sense input to voltage driven control die 20 may be coupled to other current sense means.

Figure 2:
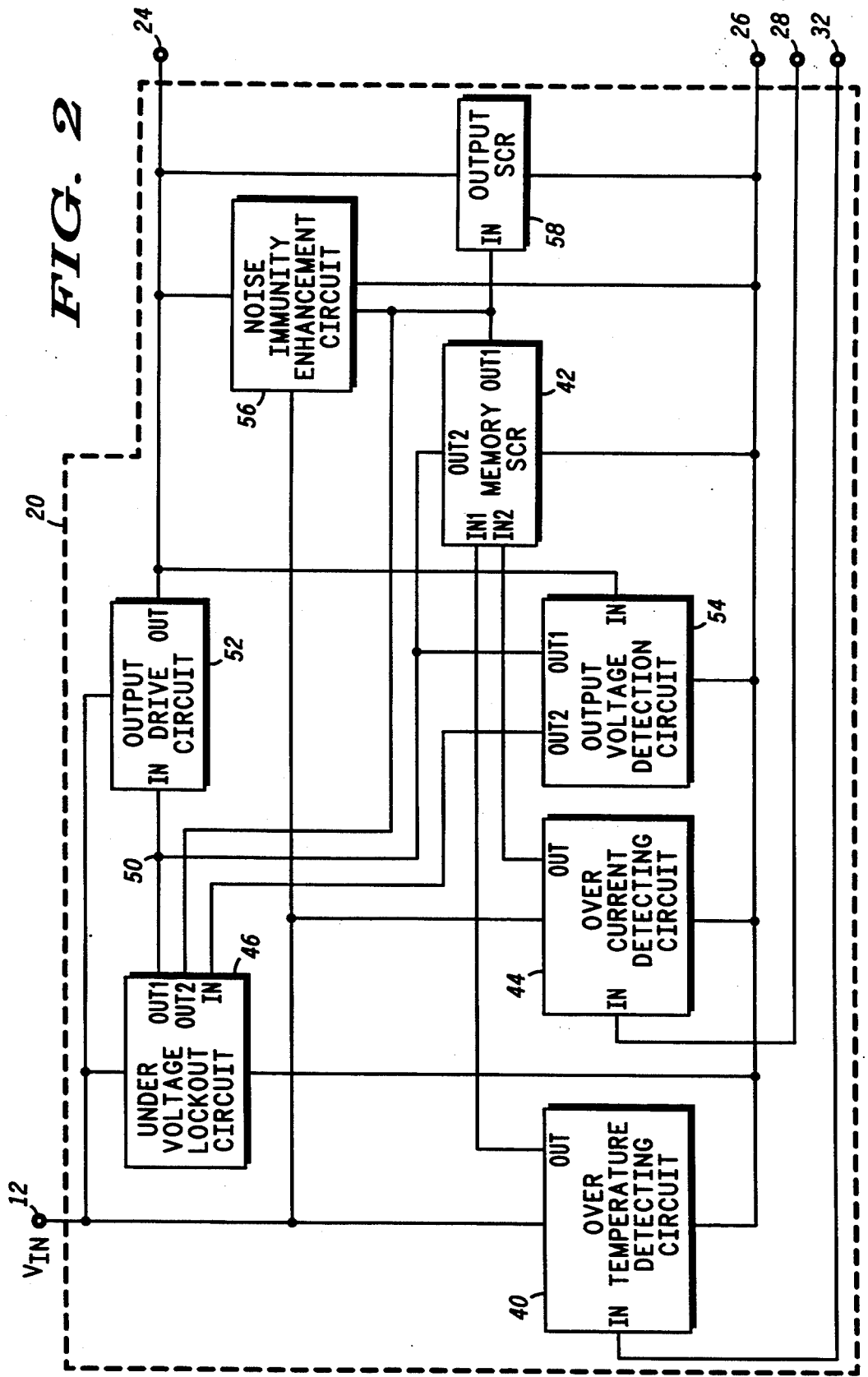
FIG. 2 is a detailed block diagram illustrating the voltage driven control circuit of FIG. 1.

Referring to FIG. 2, a detailed schematic/block diagram of voltage driven control die 20 is shown. It is understood that the components shown in FIG. 2 which are identical to components shown in FIG. 1 are identified by the same reference numbers.

Control die 20 includes over temperature detection circuit 40 being coupled between terminals 12 and 26. Over temperature detection circuit 40 is responsive to the voltage appearing at terminal 32, and having an output for providing a signal to a first input of memory SCR 42.

Similarly, over current detection circuit 44 is coupled between terminals 12 and 26. Over current detection circuit 44 is responsive to a voltage appearing at terminal 28, and having an output for providing a signal to a second input of memory SCR 42.

Under voltage lock-out circuit 46 is coupled between terminals 12 and 26 and has a first output coupled to circuit node 50 which is subsequently coupled to the control input of output drive circuit 52. Circuit 46 has second output coupled to an input terminal of output SCR 58. Under voltage lock-out circuit 46 also has a first input coupled to a second output of output voltage detection circuit 54.

Output drive circuit 52 also has an input coupled to terminal 12 and an output coupled to terminal 24.

It is worth noting that under voltage lock out circuit 46 has a high output impedance, for example, a current source output. Further, the output of under voltage lock out circuit 46 provides a control signal to the control input of output drive circuit 52 wherein this represents a control path to output drive circuit 52, while output drive circuit 52 also is coupled to terminal 12 for providing a high current path.

Memory SCR 42 has a terminal coupled to terminal 26 and a first output coupled to an input of output SCR 58. Further, memory SCR 42 has a second output coupled to circuit node 50.

Output SCR 58 has first and second terminals respectively coupled to terminals 24 and 26.

It is worth noting that the voltage signal applied at terminal 12 is the voltage supply to circuits 40, 44, 46, and 56. Moreover, since terminal 12 represents the control input to three leaded power device 10, any input signal must first pass through control die 20 before being supplied to power transistor 25. Thus, control die 20 provides complete protection for transistor 25 because the input signal to transistor 25 is monitored before it is applied to transistor 25.

Output voltage detection circuit 54 is coupled between the output of output drive circuit 52 and terminal 26, and has first and second outputs respectively coupled to circuit node 50 and under voltage lockout circuit 46 for limiting output drive circuit 52, via under voltage lockout circuit 46, when the voltage appearing across terminals 24 and 26 exceeds a predetermined threshold.

Noise immunity enhancement circuit 56 is coupled between terminal 24 and the input of output SCR 58. Noise immunity enhancement circuit 56 also has an input responsive to a voltage appearing at terminal 12.

In operation and upon turn on, the voltage appearing at terminal 24 is substantially equal to zero volts and an input voltage signal is applied at terminal 12 for turning on power device 22 ( of FIG. 1). It should be understood that since a voltage signal is applied at terminal 12, terminal 12 is a low impedance node. Under voltage lock-out circuit 46 functions in that as the voltage at terminal 12 increases, under voltage lock-out circuit 46 will not provide any drive to the input of output drive circuit 52 until the voltage appearing at terminal 12 has exceeded a predetermined threshold, for example, approximately 13.6 volts. Once the predetermined threshold is exceeded, under voltage lock-out circuit 46 then provides drive to output drive circuit 52 which provides drive to terminal 24 thereby increasing the voltage appearing at terminal 24 (and thus increasing the voltage applied to the control electrode of power device 22).

In summary, under voltage lockout circuit 46 does not allow the voltage appearing at terminal 24 to increase until the voltage appearing at terminal 12 exceeds a predetermined threshold.

As the voltage appearing at terminal 24 increases, output voltage detection circuit 54 senses this voltage and when this voltage exceeds a predetermined threshold, for example, approximately 11 volts, output voltage detection circuit 54 is activated and steals the current drive provided to output drive circuit 52 thereby functioning to limit the further charging of terminal 24.

Now once the voltage appearing at terminal 24 is increased to a value such that power device 22 is turned on, the current and temperature of power device 22 are monitored via over current detection circuit 44 and over temperature detection circuit 40, respectively. In particular, when the voltage across resistor 30 (of FIG. 1) exceeds a predetermined voltage level, over current detection circuit 44 functions to supply a signal to the second input of memory SCR 42 thereby activating and firing memory SCR 42. Similarly, if the temperature of power device 22 exceeds a predetermined temperature, diode 34 will become sufficiently forward biased such that circuit over temperature detection functions to supply a signal to the first input of memory SCR 42 thereby activating and firing memory SCR 42. Thus, it is understood that either over current detection circuit 44 or over temperature detection circuit 40 is capable of firing memory SCR 42.

Once memory SCR 42 fires, its first output is cascaded with an input of output SCR 58 thereby functioning to fire output SCR 58. Moreover, when output SCR 58 is fired, it functions to rapidly decrease the voltage appearing at terminal 24 as a result of a fault condition of either over current or over temperature. Also, when memory SCR is fired, its second output sinks the current flowing at circuit node 50 which is used to provide drive current to output drive circuit 52 thereby disabling output drive circuit 52. This current is sufficient to prevent drop-out from occurring in memory SCR 42.

In addition, noise immunity enhancement circuit 56 is provided wherein circuit 56 supplies an excess reverse bias voltage across output SCR 58 when the voltage appearing at terminal 12 exceeds a predetermined threshold voltage thereby preventing false triggering of output SCR 58. This false triggering can become a problem especially when terminal 24 is being utilized to drive devices having large capacitive inputs, which in turn are driving large inductive loads. It must be understood that by providing excess reverse bias for output SCR 58, additional circuitry is required that allows output SCR 58 to be turned off quickly. This additional circuitry will be discussed and shown in detail when describing the operation of FIG. 4.

Figure 3:
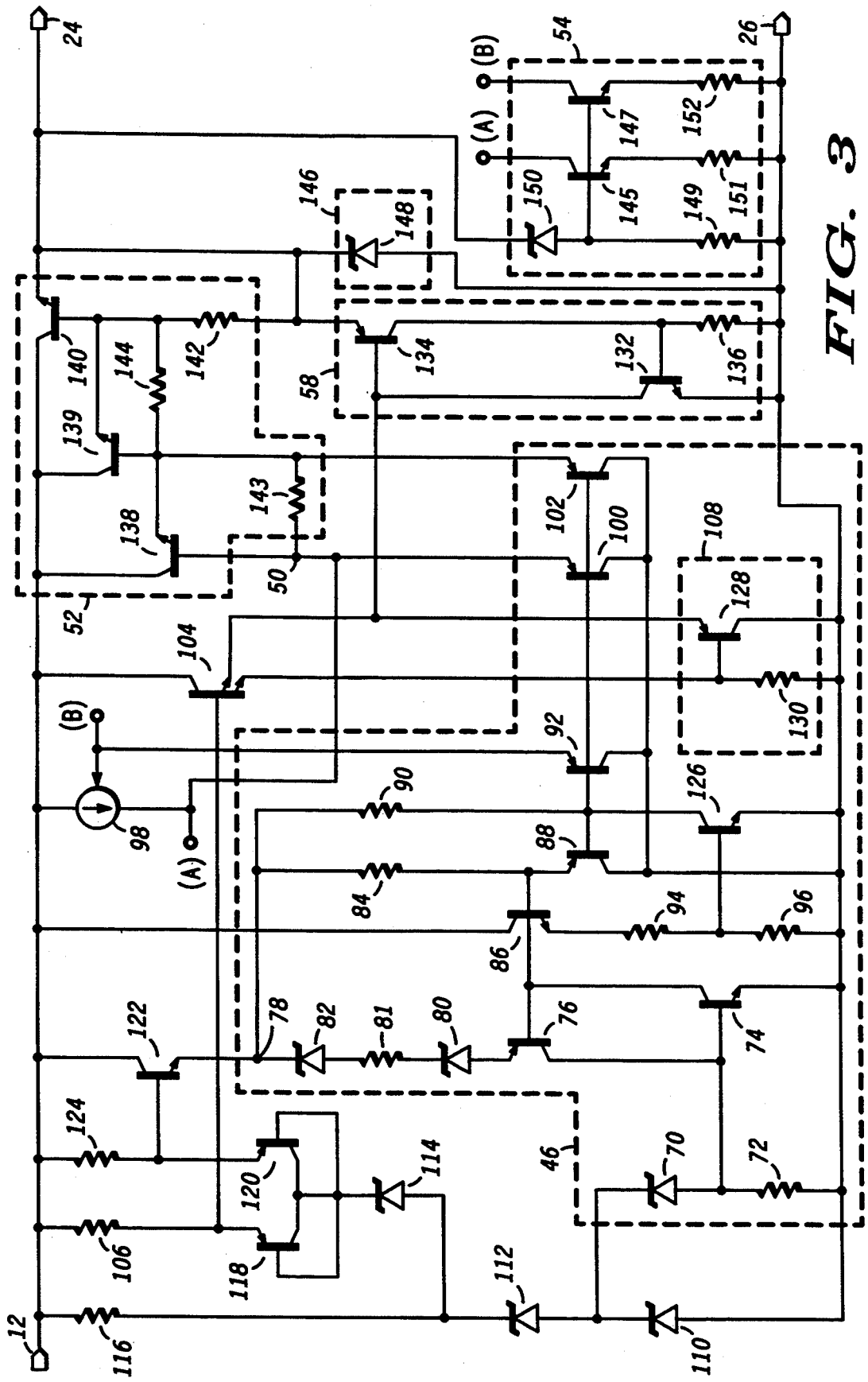
FIG. 3 is a detailed schematic diagram illustrating a portion of the voltage driven control die for implementing the under voltage lock-out circuit of FIG. 2.

Referring to FIG. 3, a portion of control die 20 is shown for illustrating the detailed operation of under voltage lock-out circuit 46. It is understood that components shown in FIG. 3 that are identical to components shown in FIGS. 1 and 2 are identified by the same reference numbers.

In particular, under voltage lock-out circuit 46 includes sub-circuit 108, which comprises a voltage clamp consisting of transistor 128 and resistor 130. Transistor 128 has its emitter coupled to the first emitter of transistor 104 and a collector coupled to terminal 26. The base of transistor 128 is coupled through resistor 130 to terminal 26. The base of transistor 128 is further coupled to the second emitter of transistor 104.

Under voltage lock-out circuit 46 also includes zener diode 70 having an anode coupled through resistor 72 to terminal 26. The anode of diode 70 is also coupled to the base of transistor 74 and to the collector of the transistor 76. The emitter of transistor 74 is coupled to terminal 26 while the collector of transistor 74 is coupled to the base of transistor 76. The emitter of transistor 76 is coupled to circuit node 78 via serially coupled elements: zener diode 80, resistor 81 and zener diode 82.

Circuit node 78 is coupled through resistor 84 and then to both the base of transistor 86 and the emitter of transistor 88. Similarly, circuit node 78 is coupled through resistor 90 and then both to the base of transistor 88 and the base of transistor 92. The collectors of transistors 88 and 92 are both coupled to terminal 26. The collector of transistor 86 is coupled to terminal 12, while the emitter of transistor of 86 is coupled through resistors 94 and 96 to terminal 26. Transistor 126 has a collector coupled to the base of transistor 88 and an emitter coupled to terminal 26. The base of transistor 126 is coupled to the common point between serially coupled resistors 94 and 96.

The emitter of transistor 92 is coupled to a control terminal of switchable current source 98 and to a second output of output voltage detection circuit 54. Current source 98 has first and second terminals respectively coupled between terminal 12 and circuit node 50 wherein the second terminal of current source 98 represents the output of under voltage lockout detection circuit 46. The second terminal of current source 98 is also coupled to a first output of over voltage detection circuit 54.

The bases of transistors 100 and 102 are coupled to the base of transistor 92 while the collectors of transistors 100 and 102 are coupled to the collector of transistor 92. The emitters of transistors 100 and 102, which represent outputs of under voltage lock-out circuit 46 are coupled to output drive circuit 52 wherein in particular, the emitter of transistor 100 is coupled to circuit node 50.

Under voltage lockout circuit 46 further includes output clamp circuit 108 which includes transistor 128 and resistor 130 which is coupled across the base and collector of transistor 128.

The circuit shown in FIG. 3 further includes transistor 104 having a collector coupled to terminal 12 and a base coupled through resistor 106 to terminal 12. A first emitter of transistor 104 is coupled to output SCR 58 and to the emitter of transistor 128 of output clamp circuit 108. The second emitter of transistor 104 is coupled to the base of transistor 128 of output clamp circuit 108.

The circuit shown in FIG. 3 also includes bias circuitry including zener diode 110 which has an anode coupled to terminal 26 and a cathode coupled to the cathode of zener diode 70 and to the anode of zener diode 112. The cathode of zener diode 112 is coupled to the anode of zener diode 114 and through resistor 116 to terminal 12. Transistor 118 has an emitter coupled to the base of transistor 104 and to terminal 12 through resistor 106. The base and collector of transistor 118 are coupled to the cathode of zener diode 114. Transistor 120 has an emitter coupled to the base of transistor 122 and through resistor 124 to terminal 12. The collector and base of transistor 120 is coupled to the cathode of zener diode 114. The collector of transistor 122 is coupled to terminal 12 while the emitter of transistor 122 is coupled to circuit node 78.

Output SCR 58 includes transistor 132 having a collector coupled to the base of transistor 134 and an emitter coupled to terminal 26. The base of transistor 132 is coupled to the collector of transistor 134 and through resistor 136 to terminal 26. The base of transistor 134 is coupled to the first emitter of transistor 104. Moreover, the emitter of transistor 134 is coupled to terminal 24.

Output drive circuit 52 includes Darlington configured transistors 138, 139 and 140. In particular, the base of transistor 138 is coupled to circuit node 50 while the collector of transistor 138 is coupled to terminal 12. The emitter of transistor 138 is coupled to the base of transistor 139 and to the emitter of transistor 102. The collectors of transistors 139 and 140 are coupled to terminal 12. The emitter of transistor 139 is coupled to the base of transistor 140 and through resistor 142 to terminal 24. Resistor 143 is coupled between the bases of transistors 138 and 139, while resistor 144 is coupled between the bases of transistors 139 and 140. Finally, the emitter of transistor 140 is coupled to terminal 24.

In addition, the circuit in FIG. 3 includes output voltage clamp 146 which is coupled between terminals 24 and 26. In particular, clamp 146 includes zener diode 148 wherein the cathode of diode 148 is coupled to terminal 24 and the anode of diode 148 is coupled to terminal 26.

Also shown in FIG. 3 is output voltage detection circuit 54 which includes transistors 145 and 147 each having their emitters coupled to terminal 26 through resistors 151 and 152 respectively, and their bases coupled through resistor 149 to terminal 26. The collector of transistor 145, which represents the first output of output voltage detection circuit 54, is coupled to circuit node 50, while the collector of transistor 147, which represents the second output of output voltage detection circuit 54, is coupled to the control terminal of programmable current source 98. The bases of transistors 145 and 147 are also coupled to an anode of zener diode 150. The cathode of zener diode 150, which represents the input of output voltage detection circuit 54, is coupled to terminal 24.

In operation, under voltage lock-out circuit 46 functions to clamp terminal 24 to a predetermined voltage when the voltage appearing at terminal 12 is below a predetermined threshold voltage. In particular, assuming that the voltage appearing at terminal 12 is below a predetermined threshold voltage, a clamping circuit functions to not allow the voltage at terminal 24 to exceed a predetermined voltage. In particular, when the voltage appearing at terminal 24 exceeds approximately 2 $V_{BE}$, transistors 134 and 128 are rendered operative and the voltage appearing at terminal 24 is clamped, for example, to 1.0 volt. Further, assuming that resistor 94 is twice the value of resistor 96, components 86, 88, 126, 94 and 96 function to clamp the voltage appearing at the bases of transistors 88, 92, 100 and 102 to approximately 3 $V_{BE}$. As a result, circuit node 50 (the input of output drive circuit 52) is clamped to approximately 4 $V_{BE}$ via transistor 100.

However, when the voltage appearing at terminal 12 exceeds a predetermined threshold voltage, for example, 13.5 volts wherein this threshold voltage is determined by the voltage across diodes 112 and 70 and resistors 116 and 72, the latch formed by transistors 74 and 76 is enabled since the voltage across resistor 72 exceeds the turn on voltage of transistor 74. This disables base current to transistor 86 which has the effect of rendering transistors 86, 88, and 126 non-operative thereby disabling the clamping operation as described above. This now allows the voltage appearing at circuit node 50 and terminal 24 to increase.

In addition, output voltage detection circuit 54 is shown such that when the voltage appearing at terminal 24 increases and exceeds a predetermined value, transistors 145 and 147 are rendered operative. In particular, transistor 145 functions to steal current away from circuit node 50, while transistor 147 functions to program programmable current source 98 to a significantly lower value.

In summary, the circuit shown in FIG. 3 includes a clamping circuit which holds the voltage appearing at terminal 24 to a low predetermined voltage until the voltage appearing at terminal 12 exceeds a predetermined threshold voltage. At this point, a latch is enabled which thereby disables the clamping circuit and allows the voltage appearing at terminal 24 to increase. It should be noted that terminals identified by the letter "A" extend from the second terminal of current source 98 and from the collector of transistor 145. In addition, the control terminal of current source 98 and the collector of transistor 147 include terminals identified by the letter "B". It should be understood that this is a commonly used notation to indicate that the terminal "A" extending from the second terminal of current source 98 is connected to the terminal "A" extending from the collector of transistor 145. Likewise, the terminal of current source 98 identified as terminal "B" is connected to the collector of transistor 147.

Figure 4:
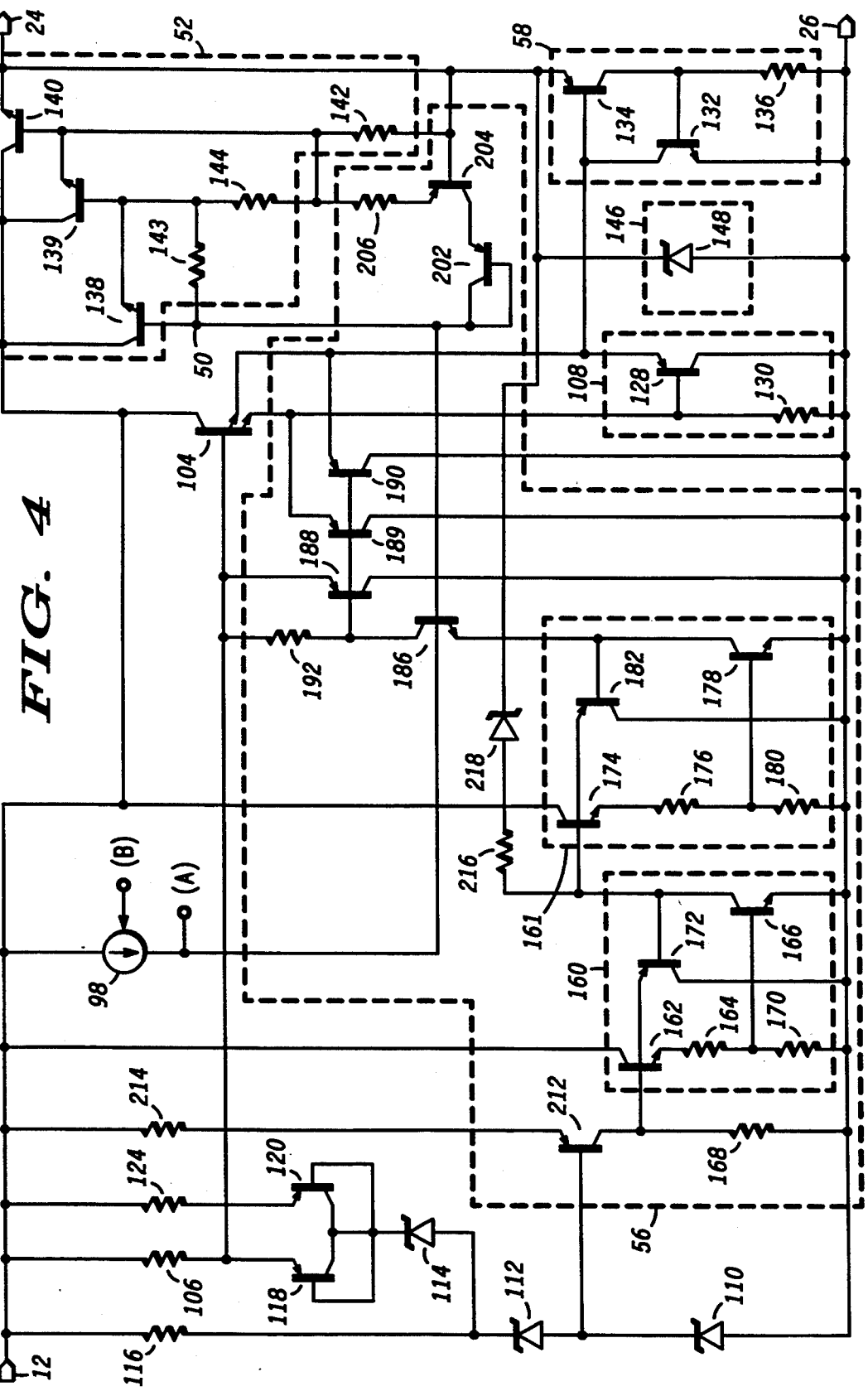
FIG. 4 is a detailed schematic diagram illustrating a portion of the voltage driven control die for implementing the noise immunity enhancement circuit of FIG. 2.

Referring to FIG. 4, a portion of the circuitry of control die 20 is shown for illustrating the detailed operation of noise immunity enhancement circuit 56 shown in FIG. 2. It is understood that components shown in FIG. 4 which are identical to components shown in FIGS. 1, 2 and 3 are identified by the same reference numbers.

Noise immunity enhancement circuit 56 includes first and second switches 160 and 161. First switch 160 includes transistor 162 having a collector coupled to terminal 12 and an emitter coupled through resistor 164 to the base of transistor 166. The base of transistor 162 is coupled through resistor 168 to terminal 26, while the base of transistor 166 is coupled through resistor 170 to terminal 26. The collector of transistor 166 is coupled to the base of transistor 172 the later of which has an emitter coupled to the base of transistor 162. The collector of transistor 172 and the emitter of transistor 166 are coupled to terminal 26.

Second switch 161 includes transistor 174 which has a collector coupled to terminal 12 and an emitter coupled through resistor 176 to the base of transistor 178. The base of transistor 174 is coupled to the base of transistor 172. The base of transistor 178 is coupled through resistor 180 to terminal 26. The collector of transistor 178 is coupled to the base of transistor 182 the latter of which has an emitter coupled to the base of transistor 174. The collector of transistor 182 as well as the emitter of transistor 178 are coupled to terminal 26.

Noise immunity enhancement circuit 56 further includes transistor 186 having an emitter coupled to the base of transistor 182 and a collector coupled to the bases of transistors 188, 189 and 190. The base of transistor 186 is coupled to circuit node 50, while the base of transistor 188 is coupled through resistor 192 to the emitter of transistor 118. The emitter of transistor 188 is also coupled to the emitter of transistor 118 and to the base of transistor 104. The emitter of transistor 189 is coupled to the second emitter of transistor 104 while the emitter of transistor 190 is coupled to the first emitter of transistor 104. The collectors of transistors 188–190 are each coupled to terminal 26.

Transistor 212 has an emitter coupled through resistor 214 to terminal 12 and a collector coupled to the base of transistor 162. The base of transistor 212 is coupled to the anode of zener diode 112.

Finally, the bases of transistors 172 and 174 are coupled through resistor 216 to the anode of zener diode 218. The cathode of zener diode 218 is coupled to terminal 24.

In operation, the circuit shown in FIG. 4 applies an excess reverse bias of approximately 7 volts across the emitter-base junction of PNP transistor 134 thereby preventing false triggering of output SCR 58. The excess reverse bias voltage ($V_{RB}$) that is applied across the emitter base junction of transistor 134 can be calculated as shown in equation 1.

$$V_{RB} = V_{D110} + V_{D112} + V_{D114} + V_{BE(118)} - V_{BE(104)} - V_{D148} \quad (1)$$

where $V_{D110}$, $V_{D112}$, $V_{D114}$, $V_{D148}$ are the respective voltages appearing across zener diodes 110, 112, 114 and 148; and $V_{BE(118)}$ and $V_{BE(104)}$ are the respective voltages appearing across the base-emitter junctions of transistors 118 and 104.

By applying this excess reverse bias voltage across the emitter-base junction of transistor 134, the threshold voltage to turn on SCR 58 from its top gate is increased by such voltage. This provides substantial noise immunity because now the voltage appearing at the emitter of transistor 134 must increase approximately 7 volts above the voltage at the base of transistor 134 during inductive load switching transients in order to false trigger transistor 134.

However, because an excess reverse bias voltage has been provided across the emitter-base junction of transistor 134, when it is desired to trigger output SCR 58 so that the voltage appearing at terminal 24 can be rapidly reduced, additional circuitry is required so that the propagation delay to turn on output SCR 58 is not substantially degraded.

This additional circuitry includes first and second switches 160 and 161, respectively. Switch 160 is rendered operative when the voltage appearing at terminal 12 exceeds a predetermined value, for example, $V_{D110} + V_{BE(212)}$. This renders the output of switch 160, which is taken at the collector of transistor 166, to be equal to a voltage that is less than the turn-on voltage for switch 161. For example, the output voltage of switch 160 may be $(3 \times V_{BE})$. As a result, when switch 160 is rendered operative, it functions to prevent switch 161 from turning on by clamping the input of switch 161 to a voltage less than its turn on voltage which may be for example $(4 \times V_{BE})$.

However, when the voltage appearing at terminal 12 is removed, switch 160 is subsequently disabled thereby allowing the voltage at the input of switch 161 to increase, via resistor 216 and diode 218 and the voltage appearing across terminals 24 and 26, and thereby turning on switch 161. This turns on transistor 174 and allows current to flow through transistors 178 and 186 wherein transistor 186 drives PNP transistors 188–190. Moreover, transistors 188–190 function to rapidly slew the base of transistor 134 thereby firing output SCR 58. This has the effect of rapidly decreasing the voltage appearing at terminal 24 in spite of the excess reverse bias voltage that was initially applied across the emitter-base junction of transistor 134.

In summary, the circuit shown in FIG. 4 includes circuitry for applying an excess reverse bias voltage across the emitter-base junction of transistor 134 thereby preventing output SCR 58 from false triggering. In addition, the circuit shown in FIG. 4 also includes circuitry for rapidly slewing output SCR 58 by detecting when the voltage at terminal 12 has fallen below a predetermined threshold and subsequently activating circuitry to pull current out from the base of transistor 134 thereby rapidly turning on output SCR 58. It should be noted that the terminals labeled "A" and "B" have been described with reference to FIG. 3.

By now it should be apparent from the foregoing discussion that a novel voltage driven control die for use with a power device has been provided. The voltage driven control die includes an under voltage lock-output circuit which inhibits drive to the power device until the input voltage exceeds a predetermined threshold voltage. Moreover, the control die includes a noise immunity enhancement circuit for providing an excess reverse bias across an output SCR for preventing false triggering of the output SCR.

While the invention has been described in specific embodiments, it is evident that many alterations, modifications, and variations will be apparent to those skilled in the art. Further, it is intended to embrace all such alterations, modifications and variations in the appended claims.

We claim:

1. A voltage driven control die having a plurality of terminals for use with a power transistor, a first one of the plurality of terminals coupled to receive an input voltage, second, third, fourth and fifth ones of the plurality of terminals coupled to the power transistor, the voltage driven control die comprising:

an over current detection circuit being coupled between the first one and the third one of the plurality of terminals and being responsive to a signal appearing between the fourth one and the third one of the plurality of terminals, said over current detection circuit providing a signal at an output of said over current detection circuit when a current through the power transistor exceeds a predetermined level;

an over temperature detection circuit being coupled between the first one and the third one of the plurality of terminals and being responsive to a voltage appearing between the fifth one and the third one of the plurality of terminals for providing a signal at an output of said over temperature detection circuit when a temperature of the power transistor exceeds a predetermined temperature;

an under voltage lockout circuit being coupled between the first one and the third one of the plurality of terminals for providing a signal at an output of said under voltage lock out circuit when a voltage appearing between the first one and the third one of the plurality of terminals exceeds a predetermined voltage;

an output drive circuit having a control terminal, an input and an output, said control terminal of said output drive circuit being coupled to said output of said under voltage lockout circuit, said input of said output drive circuit being coupled to the first one of the plurality of terminals, said output of said output drive circuit being coupled to the second one of the plurality of terminals;

a first SCR having first and second control input terminals and first and second output terminals and being coupled to the third one of the plurality of terminals, said first control input terminal of said first SCR being coupled to said output of said over temperature detection circuit, said second control input terminal of said first SCR being coupled to said output of said over current detection circuit, said first output terminal of said first SCR being coupled to said under voltage lockout circuit, said second output terminal of said first SCR being coupled to said input of said output drive circuit; and a second SCR having first and second terminals and a control input terminal, said first and second terminals of said second SCR being respectively coupled to the second one and the third one of the plurality of terminals, said control input terminal of said second SCR being coupled to said first output terminal of said first SCR.

2. The voltage driven control die according to claim 1 further including a noise immunity enhancement circuit being coupled across said second SCR, said noise immunity enhancement circuit being responsive to said voltage appearing at the first one of the plurality of terminals for providing an excess reverse bias voltage across said second SCR.

3. The voltage driven control die according to claim 2 wherein said noise immunity enhancement circuit includes:

diode bias means being coupled across said second SCR for providing an excess reverse bias voltage across said second SCR;

a first switch having an input and an output, said input of said first switch being responsive to said voltage appearing at the first one of the plurality of terminals, said output of said first switch providing a first voltage when said first switch is rendered operative;

a second switch having an input and an output, said input of said second switch being coupled to said output of said first switch, said second switch being rendered operative when a voltage appearing at said input of said second switch exceeds a predetermined threshold voltage wherein said predetermined threshold voltage is greater than said first voltage; and driving means being coupled to said output of said second switch for rapidly firing said second SCR when said second switch is rendered operative, said driving means having an output coupled to said input of said second SCR, said second switch being coupled to the second one of the plurality of terminals and being rendered operative when said voltage appearing at the first one of the plurality of terminals decreases such that said first switch is rendered non-operative thereby allowing a voltage appearing at said input of said second switch to exceed said predetermined voltage.

4. The voltage driven control die according to claim 1 further including an output voltage detection circuit being coupled between said input of said output drive circuit and the third one of the plurality of terminals, said output voltage detection circuit having an input responsive to a voltage appearing at the second one of the plurality of terminals for limiting said output drive circuit.

5. The voltage driven control die according to claim 1 wherein said under voltage lock out circuit includes:

clamping means being coupled to the second one of the plurality of terminals for clamping a voltage appearing at the second one of the plurality of terminals to a predetermined value when a voltage appearing at the first one of the plurality of terminals is below a predetermined voltage; and latch means having an input and an output for disabling said clamping means when said voltage appearing at the first one of the plurality of terminals exceeds said predetermined voltage, said input of said latch means being coupled to the first one of the plurality of terminals, said output of said latch means being coupled to said clamping means.

6. A three leaded protected power device, comprising:

a power transistor having first and second current carrying terminals, first and second sense terminals and a control terminal, the first and second current carrying terminals corresponding to first and second leads of the three leaded protected power device; and a voltage driven control circuit having a plurality of terminals, a first one of said plurality of terminals corresponding to a third lead of the three leaded protected power device, a second one of said plurality of terminals being coupled to said control terminal of said power transistor, a third one of said plurality of terminals being coupled to said second current carrying terminal of said power transistor, fourth and fifth ones of said plurality of terminals being coupled to said first and second sense terminals respectively of said power transistor, said voltage driven control circuit being powered by a voltage signal applied at said third one of the three leaded protected power device.

7. The three leaded protected power device according to claim 6 wherein said voltage driven control circuit includes:

an over current detection means for providing a signal at an output of said over current detection means when a current through said power transistor exceeds a predetermined level, said over current detection means being coupled between said first one and said third one of said plurality of terminals and being responsive to a signal appearing between said fourth one and said third one of said plurality of terminals;

an over temperature detection means being coupled between said first one and said third one of said plurality of terminals and being responsive to a voltage appearing between said fifth one and said third one of said plurality of terminals for providing a signal at an output of said over temperature detection means when a temperature of said power transistor exceeds a predetermined temperature;

an under voltage lockout means being coupled between said first one and said third one of said plurality of terminals for providing a signal at an output of said under voltage lockout circuit when a voltage appearing between said first one and said third one of the plurality of terminals exceeds a predetermined voltage;

output drive means having a control terminal, an input and an output for providing drive current to said second one of said plurality of terminals, said control terminal of said output drive means being coupled to said output of said under voltage lockout circuit, said input of said output drive means being coupled to said first one of said plurality of terminals, said output of said output drive means being coupled to said second one of said plurality of terminals; and SCR means for discharging a voltage appearing across said second and third ones of said plurality of terminals, said SCR means having first and second current carrying terminals and first and second input terminals, said first and second current carrying terminals of said SCR means being respectively coupled to said second one and said third one of said plurality of terminals, said first and second input terminals of said SCR means being respectively coupled to said outputs of said over temperature detection means and said over current detection means.

8. The three leaded protected power device according to claim 7 wherein said voltage driven control circuit further includes a noise immunity enhancement circuit being coupled across said SCR means, said noise immunity enhancement circuit being responsive to a voltage appearing at said first one of said plurality of terminals for providing an excess reverse bias voltage across said SCR means.

9. The three leaded protected power device according to claim 8 wherein said noise immunity enhancement circuit includes:

diode bias means being coupled across said SCR means for providing an excess reverse bias across said SCR means;

a first switch having an input and an output, said input of said first switch being responsive to a voltage appearing at said first one of said plurality of terminals, said output of said first switch providing a first voltage when said first switch is rendered operative;

a second switch having an input and an output, said input of said second switch being coupled to said output of said first switch, said second switch being rendered operative when a voltage appearing at said input of said second switch exceeds a predetermined threshold voltage wherein said predetermined threshold voltage is greater than said first voltage; and driving means being coupled to said output of said second switch for rapidly firing said SCR means when said second switch is rendered operative, said driving means having an output coupled to said SCR means, said second switch being coupled to said second one of said plurality of terminals and being rendered operative when said voltage appearing at said first one of said plurality of terminals decreases such that said first switch is rendered non-operative thereby allowing a voltage appearing at said input of said second switch to exceed said predetermined voltage.

10. The three leaded protected power device according to claim 7 wherein said voltage driven control circuit further includes an output voltage detection circuit being coupled between said input of said output drive means and said third one of said plurality of terminals, said output voltage detection circuit having an input responsive to a voltage appearing at said second one of the plurality of terminals for limiting said output drive means.

11. The three leaded protected power device according to claim 7 wherein said under voltage lockout means includes:

clamping means being coupled to said second one of said plurality of terminals for clamping a voltage appearing at said second one of said plurality of terminals to a predetermined value when a voltage appearing at said first one of said plurality of terminals is below a predetermined voltage; and latch means having an input and an output for disabling said clamping means when said voltage appearing at said first one of said plurality of terminals exceeds said predetermined voltage, said input of said latch means being coupled to said first one of said plurality of terminals, said output of said latch means being coupled to said clamping means.

* * * * *